United States Patent
Arndt et al.

(10) Patent No.: US 8,254,070 B2
(45) Date of Patent: Aug. 28, 2012

(54) VEHICLE ON-BOARD ELECTRIC POWER SYSTEM

(75) Inventors: Christian Arndt, Munich (DE); Alfons Graf, Kaufering (DE)

(73) Assignee: Infineon Technologies AG, Neubiberg (DE)

(*) Notice: Subject to any disclaimer, the term of this patent is extended or adjusted under 35 U.S.C. 154(b) by 1104 days.

(21) Appl. No.: 11/803,844

(22) Filed: May 15, 2007

(65) Prior Publication Data
US 2008/0007883 A1    Jan. 10, 2008

(30) Foreign Application Priority Data

May 15, 2006  (DE) .......................... 10 2006 022 920
Oct. 4, 2006   (DE) .......................... 10 2006 047 243

(51) Int. Cl.
H02H 9/04     (2006.01)
(52) U.S. Cl. ........... 361/56; 361/54; 361/91.1; 361/91.6
(58) Field of Classification Search ................ 361/91.6, 361/54, 56, 91.1
See application file for complete search history.

(56) References Cited

U.S. PATENT DOCUMENTS

| | | | | |
|---|---|---|---|---|
| 4,536,699 A | * | 8/1985 | Baker | ........................ 323/276 |
| 5,115,369 A | | 5/1992 | Robb et al. | |
| 5,119,265 A | | 6/1992 | Qualich et al. | |
| 5,166,538 A | * | 11/1992 | Norton | ........................ 307/10.1 |
| 5,304,802 A | | 4/1994 | Kumagai | |
| 5,365,099 A | | 11/1994 | Phipps et al. | |
| 5,561,313 A | | 10/1996 | Saitoh et al. | |
| 5,631,187 A | * | 5/1997 | Phipps et al. | ................ 438/237 |
| 5,812,006 A | | 9/1998 | Teggatz et al. | |
| 2006/0006851 A1 | | 1/2006 | Thiery | |
| 2006/0226820 A1 | * | 10/2006 | Farkas | ........................ 323/276 |

FOREIGN PATENT DOCUMENTS

| | | |
|---|---|---|
| DE | 43 00 100 A1 | 7/1993 |
| DE | 199 22 924 A1 | 11/2000 |
| DE | 10 2005 031 654 A1 | 3/2006 |
| EP | 0416 805 B1 | 11/1996 |
| EP | 0 599 745 B1 | 7/2001 |
| EP | 1 624 570 A1 | 2/2006 |

OTHER PUBLICATIONS

NILMS4501N: Power MOSFET with Current Mirror FET; ON Semiconductor; Mar. 2006; Rev. 3.*
Jonathan Dodge, P.E.; Power MOSFET Tutorial; Advanced Power Technology; Rev. B; Mar. 2, 2006.*
Castellazzi, A. et al. "Reliability Analysis and Modeling of Power MOSFETS in the 42 V PowerNet." *IEEE Transactions of Power Electronics*. vol. 21, No. 3. May 2006. pp. 603-612.

* cited by examiner

*Primary Examiner* — Jared Fureman
*Assistant Examiner* — Nicholas Ieva
(74) *Attorney, Agent, or Firm* — Maginot, Moore & Beck

(57) ABSTRACT

A vehicle on-board electric power system is disclosed including at least one field-effect-controlled power transistor which applies a vehicle on-board electric power system supply voltage $V_{BB}$ to a load when actuated by a logic circuit. The power transistor has a drain-source breakdown voltage $V_{DS}$ with a positive temperature coefficient $TK_{DS}$ and is provided with a clamping means for protecting against overvoltages $V_O$ occurring in the vehicle on-board electric power system. The clamping means has a clamping voltage $V_{CLAMP}$ with a positive temperature coefficient $TK_{CLAMP} \approx TK_{DS}$, the clamping voltage $V_{CLAMP}$ being lower than or equal to an anticipated maximum overvoltage $V_{Omax}$ in the vehicle on-board electric power system.

16 Claims, 3 Drawing Sheets

VEHICLE ON-BOARD ELECTRIC POWER SYSTEM

CROSS-REFERENCE TO RELATED APPLICATIONS

This application claims priority from German patent application number DE 10 2006 022 920.7, filed May 15, 2006 and German patent application number DE 10 2006 047 243.8, filed Oct. 4, 2006.

FIELD

The disclosed invention relates to a vehicle on-board electric power system, and in particular, an on-board electric power system for a vehicle having at least one field-effect-controlled power transistor.

BACKGROUND

In motor vehicle on-board electric power systems so-called load dumping plays an important role in the specification of the requirements made of the power transistors which are used in the vehicle on-board electric power system.

This load dumping occurs if the connection to the car battery fails in the motor vehicle. The charge current which is made available by the dynamo continues to flow over a time of several hundred milliseconds and has to be absorbed or taken up by the automobile electronic system until a regulator responds and assumes complete control of the charge current from the dynamo of the motor vehicle.

However, in this time, a load current which is stabilized by means of load resistors to a typical current density of, for example 50 A/cm$^2$ flows across the power transistors, as illustrated in FIGS. 1A and 1B. In this respect a zener diode arrangement $ZD_{AZ}$ is shown in FIG. 1A, and a zener voltage $V_{Z1}$ between the gate terminal G and the drain terminal D is shown in FIG. 1B.

In this regard, the part of the conventional vehicle on-board electric power system 10 shown in FIG. 1A has three inputs and outputs of a logic circuit 3 with ON for an input voltage, IS for a sensor output current and SEN for a sensor enable voltage. The current which is fed into the logic circuit 3 via IN is limited by an input resistor $R_{IN}$, and the input current from the input SEN is limited by a sensor enable resistor $R_{SEN}$. In addition, the inputs IN and SEN of the logic circuit are protected against overvoltages by a zener diode arrangement $ZD_{ESD}$ which, in the case of an overvoltage, discharges the currents limited by $R_{IN}$ and $R_{SEN}$ to an internal ground $GND_i$. Furthermore, a current which is limited by a grounding resistor $R_{GND}$ can be discharged via the zener diode arrangement $ZD_L$ to ground GND via the grounding resistor $R_{GND}$ when overvoltages occur at the on-board electric power system supply voltage terminal $V_{BB}$.

In the case of load dumping, a generator which is not shown in FIGS. 1A and 1B firstly builds up a high cut off voltage at the power transistor 2, wherein, when the zener voltage $V_{Z1}$ shown in FIG. 1B is exceeded, the zener arrangement shown there becomes electrically conductive so that a further increase in the cut off voltage switches on the gate G, i.e. before current can flow through the power transistor 2 from the source power electrode to the drain power electrode or vice versa depending on the conduction type of the power transistor 2. This current which is provided by the generator has to be discharged for some time (for example several 100 ms) at a high voltage from the power transistor 2 as forward current across the output terminal $V_{OUT}$ and the load 4 and in the process it heats the power transistor 2.

In order to avoid zener clamping at the maximum occurring load dump voltages of approximately 40 V in a passenger car on-board electric power system and approximately 58 V in a truck on-board electric power system, the minimum zener clamping voltages are selected by the power transistors in the passenger car on-board electric power system as, for example, typically 42 V and in the truck on-board electric power system as, for example, typically 60 V. The concept of active zener clamping, as shown in FIGS. 1A and 1B, has, however, the following decisive disadvantages:

1. all the other components which are connected to the voltage network must likewise withstand these high voltage requirements since the overvoltage pulse is not attenuated;
2. when a load dump overvoltage occurs, there is no flow of current in the passenger car up to approximately 40 V, i.e. no energy is extracted from the overvoltage pulse so that the overvoltage persists over a long time period;
3. a significantly higher value has to be selected for the breakdown voltage $V_{DS}$ of the semiconductor technology used than the minimum guaranteed zener clamping voltage taking into account variation, temperature drifts etc. This has an adverse effect on the chip costs. Necessary technology voltages are thus obtained for passenger car applications with 60 V and for truck applications with 80 V, which is significantly above the typical maximum load dump voltages of 40 V in a passenger car on-board electric power system or 58 V in a truck on-board electric power system;
4. the higher the active zener clamping voltage the higher also the absorbed power if the power switch goes into the clamped state. This leads to a more rapid increase in temperature and to earlier damage to the power transistors.

Documents U.S. Pat. Nos. 5,115,369 and 5,365,099 disclose such an active zener protection system in which a multiplicity of zener diodes are integrated monolithically on the semiconductor material of the power transistor. This solution has the disadvantage that the required chip area is significantly increased, thus making the fabrication costs considerably higher. As a result, the installation volume of the power transistors is also disadvantageously increased. The reliability of such highly integrated power transistors requires an increased expenditure on analysis, as is known from the document by A. Castellazzi et al. "Reliability Analysis and Modeling of Power MOSFETs in the 42 V PowerNet", IEEE Transactions on Power Electronics, Vol. 21, No. 3, May 2006, pages 603-612.

In this context, both the logic component and the power semiconductor component have until now been protected by means of the active zener clamping, i.e. from a specific zener clamping voltage the protection structure starts to conduct with a relatively low internal resistance so that a further rise in voltage at the semiconductor component is prevented. The level of the zener clamping is selected here such that only the high and short dynamic overvoltages are limited, but not the static overvoltage increases such as occur in the event of the abovementioned load dump pulse in motor vehicle electronics.

Clamping in the static state means a high power loss, specifically the product of the clamping voltage times the current, and would under certain circumstances thermally destroy the protection structures. This is particularly critical for the clamping of the power semiconductor component because here the current is determined essentially by the coupled load 4, as shown in FIG. 1A. The clamping of the logic component is relatively noncritical because it occurs in conjunction with a relatively high-impedance, current-limiting resistance $R_{GND}$, as shown in FIG. 1A.

Therefore, it would be advantageous to specify a vehicle on-board electric power system with at least one power transistor which has more efficient clamping of the power transistors. Furthermore, it would be advantageous to provide a method for protecting a vehicle on-board electric power system by using an appropriately designed power transistor.

SUMMARY

As disclosed herein, a vehicle on board electric power system comprises at least one power transistor configured to apply a vehicle on-board electric power system supply voltage $V_{BB}$ to a load, the at least one power transistor having a drain-source breakdown voltage $V_{DS}$ with a positive temperature coefficient $TK_{DS}$. The vehicle on board electric power system further comprises a logic circuit configured to actuate the at least one power transistor such that the at least one power transistor applies the vehicle on-board electric power system supply voltage $V_{BB}$ to the load. A means for clamping is provided in association with the power transistor. The means for clamping is configured to protect against overvoltages $V_O$ occurring in the vehicle on-board electric power system. The means for clamping has a clamping voltage $V_{CLAMP}$ with a positive temperature coefficient $TK_{CLAMP} \approx TK_{DS}$. The clamping voltage $V_{CLAMP}$ is lower than or equal to an anticipated maximum overvoltage $V_{Omax}$ in the vehicle on-board electric power system.

An associated method for protecting a vehicle on-board electric power system using a power transistor is also disclosed herein. The method comprises providing a field-effect-controlled power transistor with a positive temperature coefficient $TK_{DS}$ of its drain-source breakdown voltage $V_{DS}$ which applies a vehicle on-board electric power system supply voltage $V_{BB}$ to a load when actuated by a logic circuit. The method further comprises providing a clamping means with a positive temperature coefficient $TK_{CLAMP}$ of a clamping voltage $V_{CLAMP}$ as overload protection of the power transistor in the case of maximum overvoltages $V_{Omax}$. In addition, the method comprises matching of the clamping voltage $V_{CLAMP}$ so that $TK_{CLAMP} \approx TK_{DS}$ at all operating temperature fluctuations and the relationship $V_{CLAMP} \leq V_{Omax}$ is complied with.

DESCRIPTION

Figure 1A:
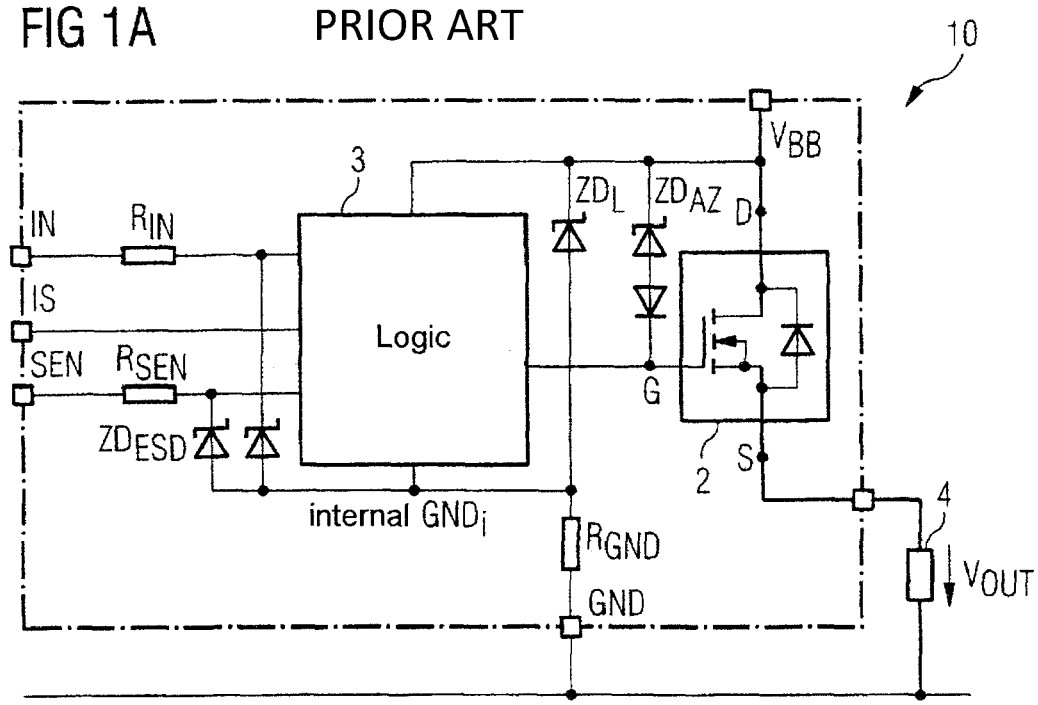
FIG. 1A shows a basic outline of part of a conventional motor vehicle on-board electric power system with a power transistor and typical active zener clamping.

According to at least one embodiment of the invention, a vehicle on-board electric power system having at least one field-effect-controlled power transistor which applies a vehicle on-board electric power system supply voltage $V_{BB}$ to a load when actuated by a logic circuit is provided. The power transistors of the vehicle on-board electric power system have a drain-source breakdown voltage $V_{DS}$ with a positive temperature coefficient $TK_{DS}$ and are provided with a clamping means for protecting against overvoltages $V_O$ occurring in the vehicle on-board electric power system. The clamping means has a clamping voltage $V_{CLAMP}$ with a positive temperature coefficient $TK_{CLAMP}$, wherein the clamping voltage $V_{CLAMP}$ is lower than or equal to an anticipated maximum overvoltage $V_{Omax}$ in the vehicle on-board electric power system, and the temperature coefficient $TK_{CLAMP} \approx TK_{DS}$ is ideally $TK_{CLAMP} = TK_{DS}$.

This embodiment entails the advantage that the breakdown voltage $V_{DS}$ of the power transistor can be significantly reduced. As a result, the costs for manufacturing the vehicle on-board electric power system are lowered drastically since power transistors of a more economical, lower cut off voltage class and with an associated lower switch-on resistance can be used. In addition, smaller housings can be used for the power transistors and the space required for the vehicle on-board electric power system circuits is reduced. As approximate calculations, simulations and demonstrator designs have shown, the semiconductor demand per unit area and volume required for the semiconductors can be reduced by 50% to 70%.

In at least one embodiment of the invention, the field-effect-controlled power transistor has zener diodes as clamping means, so that both the drain-source breakdown voltage $V_{DS}$ and the clamping voltage $V_{CLAMP}$ of the clamping means rise with the increase in the operating temperature and reduce the current through the power transistor and through the load, and can even set it to zero. The zener diodes are, in contrast to the conventional zener diode arrangements, not temperature compensated but rather their zener breakdown is matched to the temperature coefficient $TK_{DS}$. During the inherent clamping, the power transistor is clamped by means of its inherent avalanche breakdown, i.e. the power transistor is dimensioned in such a way that when the condition $V_{CLAMP} < V_O$ is met it goes into a reversible avalanche mode.

In a further embodiment, an inherent clamping structure which is based on an avalanche breakdown and whose temperature coefficient $TK_{CLAMP}$ corresponds to the temperature coefficient $TK_{DS}$ of the field-effect-controlled power transistor is provided as clamping means so that in at least one embodiment of the invention the positive temperature coefficients $TK_{CLAMP}$ and $TK_{DS}$ of the clamping voltage $V_{CLAMP}$ and of the drain-source voltage $V_{DS}$ are identical to $TK_{CLAMP} = TK_{DS}$, and the clamping voltage $V_{CLAMP}$ rises synchronously with the drain-source voltage $V_{DS}$ in the operating temperature.

For this purpose the power transistor has a positive temperature coefficient $TK_{DS}$ for an avalanche voltage in order to protect it against overloading. The avalanche voltage for triggering the avalanche effect in the power transistor is lower than or equal to the anticipated maximum overvoltage $V_{Omax}$ in the vehicle on-board electric power system to be protected, so that an overload current can be discharged both through the self-protecting power transistor with inherent clamping means and through the load which is coupled to the power transistor.

Since with the previous way of structuring a vehicle on-board electric power system it was necessary to ensure that the avalanche voltage was also not reached in the case of a load dump for the power transistor, and since according to previous understanding the avalanche breakdown was to be avoided in all cases, power transistors were used which only reached the critical current density of an avalanche at excessively increased voltages which were clearly above the maximum overvoltages $V_{Omax}$ of a load dump, or it was conventionally ensured through active zener protection that the clamping voltage $V_{CLAMP}$ was kept lower than the avalanche voltage.

Furthermore, by providing an inherent clamping means in the power semiconductor component it can be ensured that the avalanche is used to discharge overload currents both through the power transistor which protects itself using the inherent clamping means and through the load which is coupled to the power transistor. For this purpose, semiconductor components were developed in which the occurrence of "hot spots" is avoided in the case of an avalanche.

In at least one embodiment of the invention, the vehicle on-board electric power system has a plurality of power transistors which switch off different loads in the off state and switch on said loads in the on state, the power transistors being arranged with their inherent clamping means between the load and the vehicle on-board electric power system voltage $V_{BB}$ and in the event of an overvoltage of a vehicle on-board electric power system when the avalanche voltage of the power transistor is exceeded, they activate the inherent clamping means with respect to the drain-source voltage and reduce the overvoltage $V_O$.

As an outstanding application, the overload-protected power transistors are used as switches and/or as switching semiconductor elements in high side or low side switches or in half bridge circuits, in full bridge circuits, in phase bridge circuits and/or in DC/DC converters.

The overload-protected power transistors are preferably used to start and generate a power supply of the on-board electric power system of a motor vehicle and serve as electrically supported steering aids and for actuating different DC motors such as, for example, radiator fans or window lifters, but also for switching simple heating resistors, flashing indicator lights, full beam headlights, dipped beam headlights, parking lights, air conditioning system functions, glow plugs, generators, hydraulic valves etc. which can be supplied in a simple and space saving way by means of a power transistor with inherent clamping means even in the event of overvoltages $V_O$ of 60 V to 70 V.

When an avalanche is brought about which, according to one embodiment of the invention is to be brought about with a lower voltage than the anticipated overvoltages $V_O$, the thermal loading capacity of the power transistors is matched to temperature fluctuations in the vehicle on-board electric power system between −40° C. and 350° C. This high degree of temperature protection is provided between −40° C. and 350° C. for brief, dynamically occurring overloads such as short circuits or overvoltage pulses. For other temperature loads, the thermal loadability of the power transistors of the vehicle on-board electric power system is matched to operating temperature fluctuations between −40° C. and 150° C.

Since the clamping voltage $V_{CLAMP}$ is implemented in the form of the avalanche voltage and the technology voltage is implemented in the form of the breakdown voltage $V_{DS}$ of the power transistor in a power semiconductor component, both effects, specifically the breakdown voltage $V_{DS}$ and the avalanche voltage, exhibit the same thermal behavior and are based on a positive temperature coefficient $TK_{DS}=TK_{CLAMP}$, i.e. as the temperature increases both the breakdown voltage $V_{DS}$ and the avalanche voltage rise.

In at least one embodiment of the invention, the voltage level of the avalanche voltage of the inherent clamping means of the power transistor is lower than the load dump overvoltage which occurs in the case of a load dump and higher than the maximum static operating voltage $V_{BB}$. This maximum static operating voltage $V_{BB}$ can have a range up to 28 V in passenger car on-board electric power systems and up to 34 V in truck on-board electric power systems.

Zener diodes can be provided as clamping means if they have a corresponding positive temperature coefficient $TK_{CLAMP}$ of their clamping voltage $V_{CLAMP}$.

In a further method variant, an inherent clamping means of the power transistor is used. In this case, the power transistor can be designed in such a way that as the temperature increases the drain-source breakdown voltage $V_{DS}$ also rises so that the drain-source breakdown voltage $V_{DS}$ and the clamping voltage $V_{CLAMP}$ have identical positive temperature coefficients with $TK_{DS}=TK_{CLAMP}$.

In addition, for the method for protecting a vehicle on-board electric power system, it is possible to provide a zener-effect-free gate control circuit and the inherent clamping means, based on an avalanche breakdown, of the field-effect-controlled power transistor by making available a power transistor with a positive temperature coefficient $TK_{DS}=TK_{CLAMP}$ for an avalanche voltage. As a result, the temperature-dependent curves for the breakdown voltage $V_{DS}$, for the technology voltage, for the avalanche voltage and for the clamping voltage $V_{CLAMP}$ preferably have synchronous profiles and vary in a linear or nonlinear positive fashion as a function of the temperature.

With a further step, the avalanche voltage is set in such a way that the avalanche voltage is lower than an anticipated maximum overvoltage $V_{Omax}$ in the vehicle on-board electric power system to be protected. This can be done by correspondingly matching the dopant concentration and/or area of the power semiconductor transistor. In a further matching step, the drain-source breakdown voltage $V_{DS}$ is matched in such a way that the drain-source breakdown voltage $V_{DS}$ is higher than or equal to the avalanche voltage of the inherent clamping means in the operating temperature intervals which occur.

Given an identical profile of the avalanche voltage and breakdown voltage $V_{DS}$, these voltages increase synchronously with one another if the temperature rises, and on the other hand it is also possible to match the drain-source breakdown voltage $V_{DS}$ in such a way that it is somewhat higher and larger than the avalanche voltage. A secondary effect of this method is additionally that at the high off state currents, the overvoltage protection of the power transistor becomes more responsive or quicker.

Furthermore there is provision that, in order to trigger the avalanche effect by exceeding a critical current density in the power transistor, the avalanche voltage is lower than an anticipated maximum overvoltage $V_{Omax}$ in one of the vehicle on-board electric power systems to be protected. The advantage of this method variant has already been discussed in detail and essentially consists in the fact that the semiconductor chip area of a power transistor with a lateral drift path or the epitaxial thickness of a power transistor with a vertical drift path can be minimized to the critical voltage for the avalanche effect.

The waste heat which occurs in the case of an avalanche owing to the overload currents at the inherent clamping means within the power transistor can, on the one hand, be discharged via external surfaces of the power electrodes so that the power transistor is not thermally overloaded. On the other hand it is also possible for the power transistor to be equipped with cooling fins for discharging heat, said cooling fins being coupled thermally and electrically to the power electrodes.

In addition, with the method there is provision for the inherent clamping means and the thermal conductivity of the power transistor to be matched to one another in such a way that the waste energy of a load dump event in an on-board electric power system of a motor vehicle is discharged in the avalanche state via the power transistor through interaction with an externally coupled load. As already mentioned above, in this method the power transistor can be matched with its breakdown voltage $V_{DS}$ and its avalanche voltage to different vehicle on-board electric power system voltages $V_{BB}$ in such a way that the breakdown voltage $V_{DS}$ and avalanche voltage correspond to the vehicle on-board electric power system voltages $V_{BB}$ and are lower than an anticipated maximum overvoltage $V_{Omax}$ in the vehicle on-board electric power system. The possible vehicle on-board electric power system voltages $V_{BB}$ have already been discussed above and will not be repeated at this point. The temperature ranges with their thermal loads for the power transistor have also already been mentioned above and will not be discussed here once more.

For the different voltage ranges in a passenger car on-board electric power system and a truck on-board electric power system the corresponding voltage levels of the avalanche voltage of the inherent clamping means of the power transistor are correspondingly set in such a way that the avalanche voltage is lower than or equal to the load dump overvoltages which occur, in order to discharge the latter via the power transistor and via the load which is connected downstream.

A series of such applications is, for example, the direct injection of fuel in which the rapid response of the injection valves is brought about using high voltages. For this purpose, power transistors with a dielectric strength above 80 V are used. The same also applies to applications in which a relatively high dielectric strength of power transistors is used exclusively to demagnetize inductors more quickly at a relatively high overvoltage. Here there is the desire for the avalanche voltages of the power transistors to reach a range greater than 60 V. For the sake of completeness it is also possible to mention the fact that numerous industrial on-board electric power systems also operate with operating voltages $V_{BB}$ of 24 V or 48 V and correspondingly matched power switches with a corresponding dielectric strength.

An advantage of matched clamping voltages $V_{CLAMP}$ for a vehicle on-board electric power system is that the chip area for the power transistor is dependent on the vehicle on-board electric power system operating voltage $V_{BB}$, and when the switching power is unchanged it decreases as the operating voltage $V_{BB}$ increases, especially since the necessary conductivity of a power transistor decreases quadratically with the vehicle on-board electric power system operating voltage $V_{BB}$, for which reason the resulting semiconductor chip area of the power transistor can be drastically reduced.

Since the new semiconductor solution allows the expenditure on an overload-protected drive circuit to be reduced and permits active zener clamping arrangements for a large number of the power transistors of a vehicle on-board electric power system in at least one embodiment of the invention, savings in terms of the connection lines in the vehicle on-board electric power system are generally also possible. In addition, the vehicle on-board electric power systems with such power switches provide more functionality in terms of diagnostics. By virtue of the possibility of using smaller chip areas in smaller housings, which is provided by the at least one embodiment of the invention mentioned here, the circuit board for the vehicle on-board electric power system can be made significantly more compact.

By virtue of the self-protection measures of the power transistor even in the case of low-energy dynamic overvoltages such as, for example, when switching inductors, the operation of the power transistor in the avalanche mode is a large advantage if at the same time the technology-conditioned breakdown voltage $V_{DS}$ is also reduced.

This method brings about a situation in the vehicle on-board electric power system in which the load is briefly partly or completely switched on for a brief time when an overvoltage $V_O$ occurs. For most loads such as motors, heating resistors or relatively large lamp units, this is generally advantageous or without serious disadvantages. However, this procedure cannot be used in applications such as ABS valves which are relevant to safety.

Turning now to the figures, FIG. 1A shows a basic outline of part of a conventional motor vehicle on-board electric power system 10 with a power transistor 2 and typical active zener clamping, as has already been mentioned in the introduction.

Figure 1B:
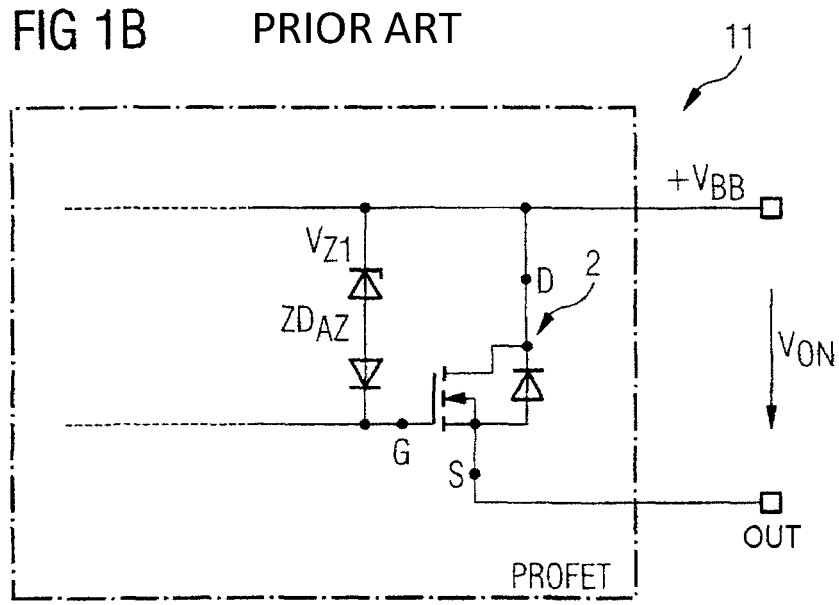
FIG. 1B shows typical active zener clamping of a smart power transistor PROFET of a conventional motor vehicle on-board electric power system according to FIG. 1A.

FIG. 1B shows typical active zener clamping of a power transistor which interacts with a logic part 3, as shown in FIG. 1A, of a conventional motor vehicle on-board electric power system 10 such as has already been explained at the beginning.

Figure 2:
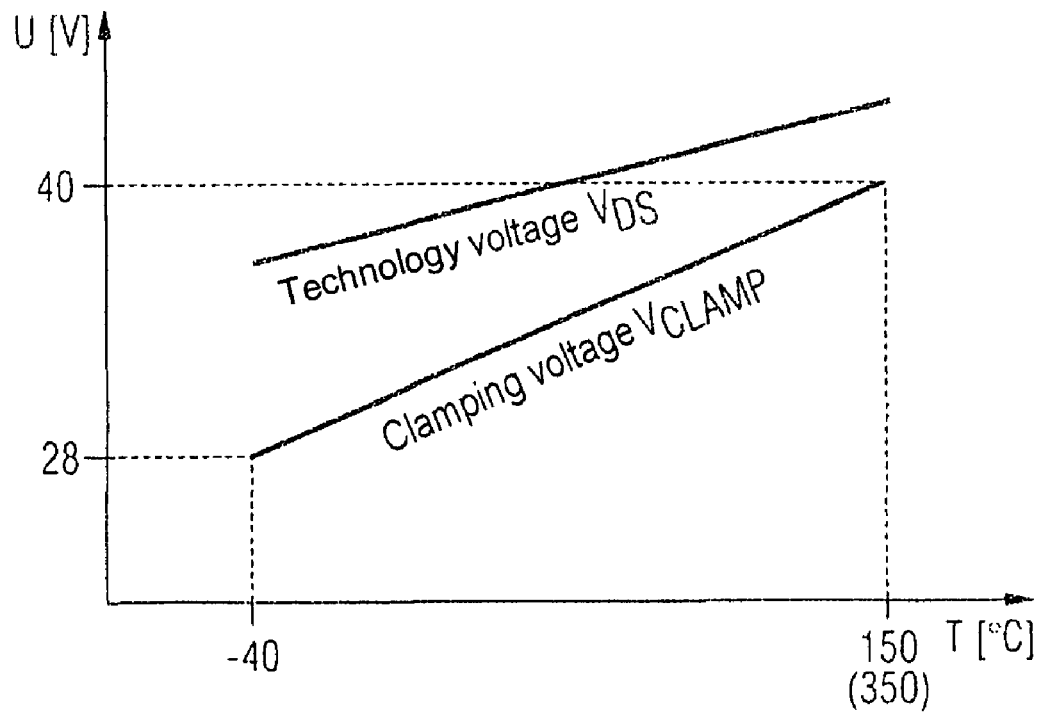
FIG. 2 shows a schematic diagram of a linear temperature-dependent profile of a breakdown voltage $V_{DS}$ of a power transistor and of an avalanche voltage of an inherent clamping means of the power transistor for a motor vehicle on-board electric power system.

FIG. 2 shows a schematic diagram of a linear temperature-dependent profile of a breakdown voltage $V_{DS}$ of a power transistor and of an avalanche voltage of an inherent clamping means of the power transistor for a motor vehicle on-board electric power system according to at least one embodiment of the invention. For this purpose, the operating voltage U is plotted in volts V on the ordinate, and the temperature T is plotted in ° C. on the abscissa, with a temperature interval of −40° C. to +150° C. or 350° C. being plotted on the abscissa and an interval of a voltage between 28 V and 40 V being plotted.

In this at least one embodiment of the invention the breakdown voltage $V_{DS}$ which is characterized as a technology voltage in the diagram since it can be defined technologically by the length of the drift path, is higher than the avalanche voltage of an inherent clamping means of the power transistor, referred to in this diagram as the clamping voltage $V_{CLAMP}$, in which case the avalanche voltage starts when a critical voltage at the power transistor is exceeded. This avalanche voltage shows in this diagram a linear dependence on the temperature T in the range from −40° C. to 150° C. between 28 V and 40 V, while the technology voltage or the drain-source breakdown voltage $V_{DS}$ is above it and rises from approximately 35 V at −40° C. to approximately 45 V at 150° C. or 350° C.

The interval between the technology voltage and the clamping voltage $V_{CLAMP}$ which can be seen in FIG. 2 does not provide a direct advantage for the application in a motor vehicle on-board electric power system but rather entails additional costs owing to the need for a larger chip area in order to bring about the relatively high technology voltage. The costs are lowest if the clamping voltage $V_{CLAMP}$ and technology voltage vary synchronously and with a minimum interval between them. This can be brought about by approximating the technology voltage to the clamping voltage $V_{CLAMP}$, or vice versa, by correspondingly varying the semiconductor technology, which is correspondingly matched, or the geometry or the layout or else the circuitry. In addition, the profile of the technology voltage and that of the clamping voltage $V_{CLAMP}$ can be coupled to one another by using, for example, inherent avalanche clamping of the power transistor.

Figure 3:
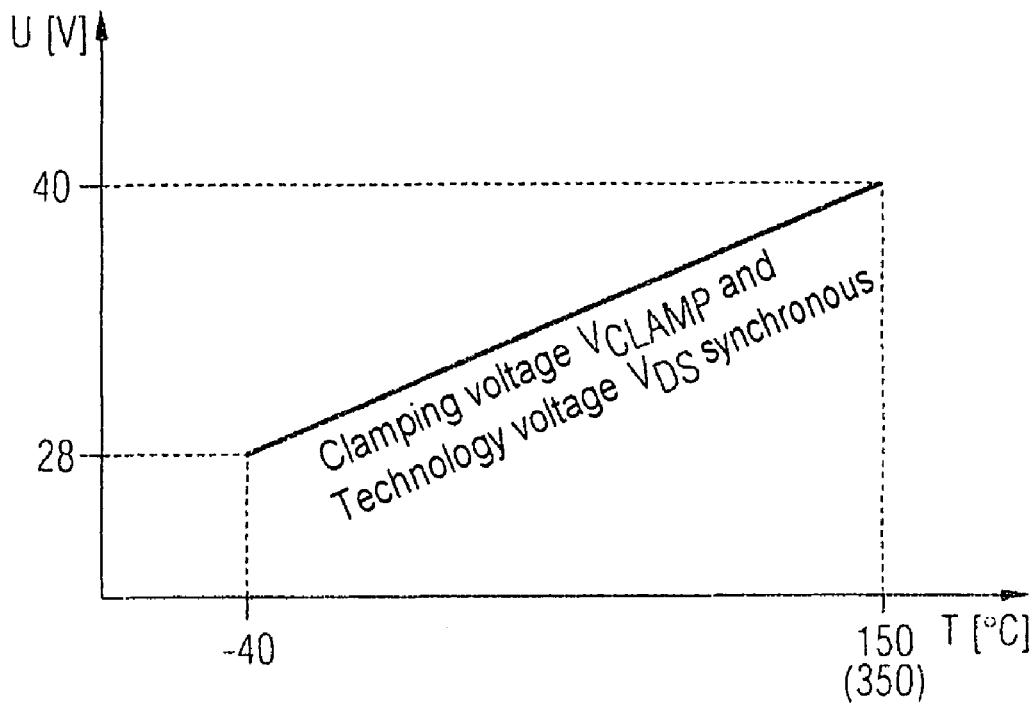
FIG. 3 shows a schematic diagram of a linear temperature-dependent synchronous profile of a breakdown voltage $V_{DS}$ of a power transistor and of an avalanche voltage of an inherent clamping means of the power transistor for a motor vehicle on-board electric power system in which the breakdown voltage $V_{DS}$ and clamping voltage $V_{CLAMP}$ vary in synchronism with one another.

FIG. 3 shows a schematic diagram of a linear temperature-dependent synchronous profile of a breakdown voltage $V_{DS}$ of a power transistor and of an avalanche voltage of an inherent clamping means of the power transistor for a motor vehicle on-board electric power system. By virtue of the synchronously varying range between 28 V and 40 V for the clamping voltage $V_{CLAMP}$ and the technology voltage of the power transistor the latter is optimized for use in a motor vehicle. In order to reduce the chip costs even further, it is possible, specifically in the application in a motor vehicle, for the clamping voltage $V_{CLAMP}$ not to be set larger than 28 V at −40° C. component temperature, as shown in FIG. 3, but rather for it to be kept, for example, lower at approximately 20 V. The background to this is that a motor vehicle on-board electric power system voltage of 20 V can be present for any period of time while so-called jump starting at 28 V persists for only one to two minutes.

The positive temperature coefficient $TK_{CLAMP}$ of the clamping voltage $V_{CLAMP}$ or avalanche voltage must then be selected in such a way that when a jump start pulse of 28 V occurs for 1-2 minutes, both the power transistor is no longer heated as permitted, for example 25° C., 150° C. or 350° C., and the load is no longer loaded with current as permitted, especially since otherwise the lamps can be destroyed or undesired starting of the motors can occur. The chronological profile of the heating of the power transistor is matched specifically to the application requirements in these cases.

Figure 4:
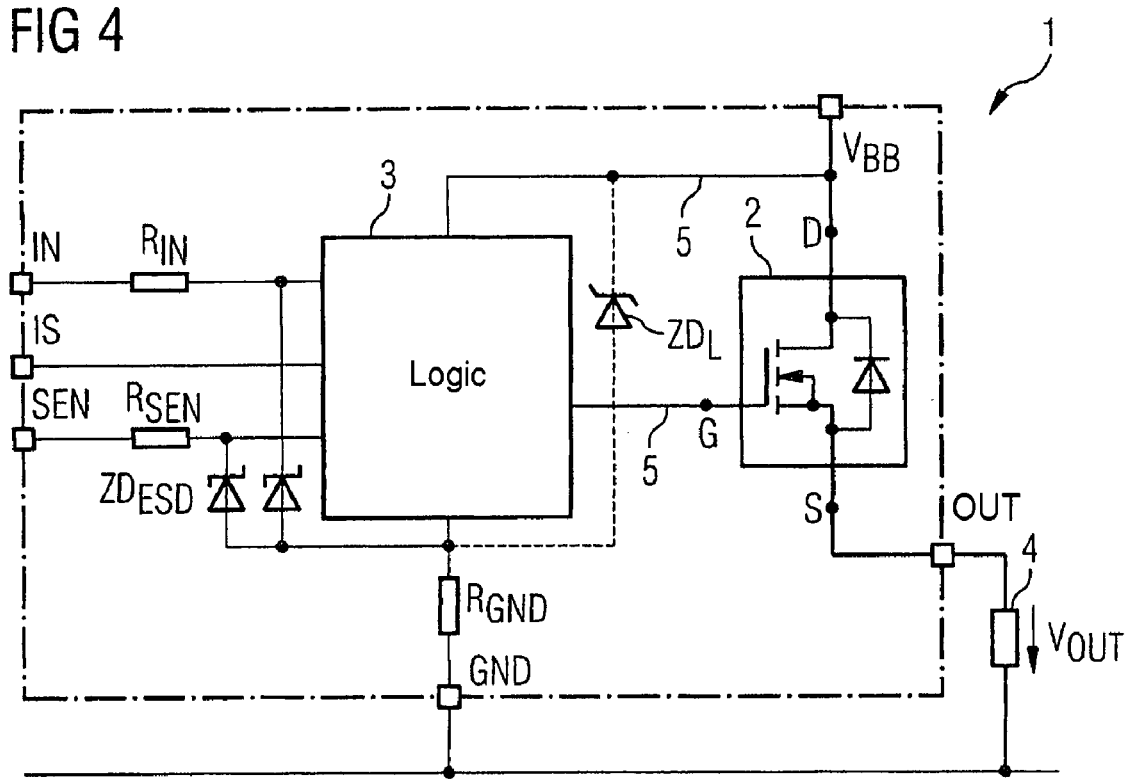
FIG. 4 shows a basic outline of part of a vehicle on-board electric power system according to at least one embodiment of the invention with a power transistor with inherent clamping means.

FIG. 4 shows a basic outline of part of a vehicle on-board electric power system 1 according to at least one embodiment of the invention with a power transistor 2 with inherent clamping means. Components with the same functions as in FIGS. 1A and 1B are characterized with identical reference symbols and not mentioned separately. The significant difference with regard to the basic outline according to FIG. 1A is that any active zener protection in the gate control circuit of the power transistor 2 is dispensed with and no combination of zener diodes and diode is connected parallel to the power transistor 2, between the drain and gate, and thus, on the one hand, a zener-effect-free gate control circuit 5 can be provided for the power transistor 2. On the other hand, the additional circuitry shown by dashed lines indicates a possible way of retaining the zener diode $ZD_L$, which serves to provide active zener protection of the logic IC, and of only reducing the avalanche voltage of the power transistor.

As a result, savings are made not only in terms of discrete components but also in terms of the monolithically integrated zener diodes which are known according to U.S. Pat. No. 5,115,369. In addition, from the outset, using the avalanche for the power transistor 2 use of the avalanche to discharge energy which is impressed through overvoltage $V_O$ discharges the latter via the power transistor 2 and the load 4 which is connected downstream, without overheating the power transistor.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A vehicle on-board electric power system comprising:
   at least one field-effect-controlled power transistor configured to apply a vehicle on-board electric power system supply voltage $V_{BB}$ to a load, the load comprising a vehicle electronic system, the at least one field-effect-controlled power transistor having a drain-source breakdown voltage $V_{DS}$ with a positive temperature coefficient $TK_{DS}$;
   a logic circuit configured to actuate the at least one field-effect-controlled power transistor such that the at least one field-effect-controlled power transistor applies the vehicle on-board electric power system supply voltage $V_{BB}$ to the load;
   a clamping member configured to provide a clamping voltage $V_{CLAMP}$ to the at least one field-effect-controlled power transistor, the clamping voltage configured to protect against overvoltages $V_o$ occurring in the vehicle on-board electric power system, wherein the clamping voltage $V_{CLAMP}$ has a positive temperature coefficient $TK_{CLAMP} \approx TK_{DS}$, and the clamping voltage $V_{CLAMP}$ is lower than or equal to an anticipated maximum overvoltage $V_{Omax}$ in the vehicle on-board electric power system,
   wherein an inherent parasitic clamping structure of the at least one field-effect-controlled power transistor which is based on an avalanche breakdown is provided as the clamping member, and
   wherein the clamping voltage $V_{CLAMP}$ is implemented in the form of an avalanche voltage, so that the at least one field-effect-controlled power transistor has a positive temperature coefficient $TK_{DS}=TK_{CLAMP}$ for the avalanche voltage in order to protect it against overloading, and wherein the avalanche voltage for triggering the avalanche breakdown of the inherent parasitic clamping structure in the at least one field-effect-controlled power transistor is lower than or equal to the anticipated maximum overvoltage $V_{Omax}$ in the vehicle on-board electric power system to be protected, so that an overload current is discharged both through the at least one field-effect-controlled power transistor with the inherent parasitic clamping structure and through the load which is coupled to the at least one field-effect-controlled power transistor.

2. The vehicle on-board electric power system as claimed in claim 1, wherein the clamping member further comprises at least one zener diode.

3. The vehicle on-board electric power system as claimed in claim 1, wherein the at least one power transistor comprises at least two power transistors configured to switch off different loads in an off state and switch on said loads in an on state, where each one of at least two power transistor is arranged with the inherent clamping means between the load and the vehicle on-board electric power system and, in the event of an overvoltage of the vehicle on-board electric power system when the avalanche voltage of at least one of the power transistors is exceeded, the at least one of the power transistors activates the inherent clamping structure and reduces an overvoltage Vo.

4. The vehicle on-board electric power system as claimed in claim 1, wherein the vehicle on-board electric power system comprises overload-protected power transistors as switches and/or as switching semiconductor elements in half bridge circuits, in full bridge circuits, in phase bridge circuits and/or in DC/DC converters.

5. The vehicle on-board electric power system as claimed in claim 1, wherein the vehicle electronic system comprises flashing indicator lights, full beam headlights, dipped beam headlights, parking lights, air conditioning system, heating resistors, glow plugs, generators, DC motors, and/or hydraulic valves.

6. The vehicle on-board electric power system as claimed in claim 1, wherein a thermal loadability of the at least one power transistor is matched to operating temperature fluctuations in the vehicle on-board electric power system between −40° C. and 350° C.

7. The vehicle on-board electric power system as claimed in claim 1, wherein a thermal loadability of the at least one power transistor is matched to operating temperature fluctuations in the vehicle on-board electric power system between 31 40° C. and 150° C.

8. The vehicle on-board electric power system as claimed in claim 1, wherein the voltage level of the avalanche voltage of the inherent clamping means of the at least one power transistor is lower than or equal to the load dump overvoltage occurring and higher than the maximum static vehicle on-board electric power system supply voltage $V_{BB}$.

9. The vehicle on-board electric power system as claimed in claim 1, wherein in a temperature range from −40° C. to 25° C. the avalanche voltage is lower than the maximum static vehicle on-board electric power system voltage VBB, and higher than VBB at 25° C. and higher temperatures.

10. The vehicle on-board electric power system as claimed in claim 1, wherein the at least one power transistor is configured such that in the case of a load dump overvoltage in the vehicle on-board electric power system the at least one power transistor is clamped and an inherently controlled current flows across the clamped power transistor and across the load.

11. The vehicle on-board electric power system of claim 1, wherein the at least one field-effect-controlled power transistor is configured such that the drain-source breakdown voltage, the avalanche voltage, and the clamping voltage define temperature-dependent curves with synchronous profiles that vary as a function of temperature.

12. The vehicle on-board electric power system of claim 1, wherein the at least one field-effect-controlled power transistor has a dopant concentration selected to cause the avalanche voltage to be lower than or equal to the anticipated maximum overvoltage $V_{Omax}$.

13. The vehicle on-board electric power system of claim 1, wherein the at least one field-effect-controlled power transistor is dimensioned to cause the avalanche voltage to be lower than or equal to the anticipated maximum overvoltage $V_{Omax}$.

14. The vehicle on-board electric power system of claim 13, wherein the at least one field-effect-controlled power transistor has a lateral drift path, and wherein the at least one field-effect-controlled power transistor has an area that is sized to cause the avalanche voltage to be lower than or equal to the anticipated maximum overvoltage $V_{Omax}$.

15. The vehicle on-board electric power system of claim 13, wherein the at least one field-effect-controlled power transistor has a vertical drift path, and wherein the at least one field-effect-controlled power transistor has an epitaxial thickness that is sized to cause the avalanche voltage to be lower than or equal to the anticipated maximum overvoltage $V_{Omax}$.

16. The vehicle on-board electric power system of claim 13, further comprising: a zener-effect-free gate control circuit connecting the logic circuit to a gate of the at least one field-effect-controlled power transistor.

* * * * *